United States Patent [19]

Herr

[11] Patent Number: 4,584,691
[45] Date of Patent: Apr. 22, 1986

[54] TIMED PULSE COMMUNICATION SYSTEM

[76] Inventor: Ernest A. Herr, 1850 Rominger Rd., Winston-Salem, N.C. 27107

[21] Appl. No.: 523,101

[22] Filed: Aug. 15, 1983

[51] Int. Cl.⁴ .............................................. H03K 7/08
[52] U.S. Cl. .................................... 375/22; 332/9 R; 340/353; 340/365 S; 329/106
[58] Field of Search .............. 375/21, 22; 178/33 MP, 178/66.1, 79, 81; 340/353, 365 S, 825.63; 307/234, 265; 332/9 T, 10, 14; 329/105, 106, 107; 370/9

[56] References Cited

U.S. PATENT DOCUMENTS

| | | | |
|---|---|---|---|
| 2,345,987 | 4/1944 | Neiswinter | 340/353 |
| 3,699,254 | 10/1972 | Nailen | 375/21 |
| 3,781,874 | 12/1973 | Jennings | 340/365 S |
| 3,845,473 | 10/1974 | Kawashima | 340/365 S |
| 3,944,982 | 3/1976 | Mogi et al. | 340/825.63 |
| 3,949,199 | 4/1976 | Odom | 375/22 |
| 3,980,960 | 9/1976 | Hutchinson | 340/825.63 |
| 3,983,325 | 9/1976 | Öllinger et al. | 178/81 |
| 4,188,581 | 2/1980 | Stevenson | 329/106 |
| 4,189,713 | 2/1980 | Duffy | 340/825.63 |

Primary Examiner—Benedict V. Safourek
Attorney, Agent, or Firm—Buell, Ziesenheim, Beck & Alstadt

[57] ABSTRACT

A modulator and demodulator is described for a carrier frequency which is modulated by continuous pulses of different lengths time-wise, as many different lengths being provided as the number of letters, numbers, signs or even words require. The pulse generator comprises a stable oscillator and cycle counters which are controlled by a typewriter-type keyboard. The counters count cycles corresponding in aggregate duration to selected characters. Continuous pulses of duration equal to the aggregate durations of the counted cycles are generated in response to those counters. The receiver comprises a stable oscillator identical with that of the pulse generator, which is gated by the modulated carrier frequency. Cycle counters count the cycles in the gated pulses, and a read-only memory and display transform the counts into characters.

7 Claims, 3 Drawing Figures

TIMED PULSE COMMUNICATION SYSTEM

This invention relates to systems that communicate by means other than voice. It is more particularly concerned with such systems in which communication is carried on by digital pulses.

BACKGROUND OF THE INVENTION

The first system of long distance communication by electrical means was, of course, telegraphy using a code of dots and dashes, that is, short and long pulses. The exact length of dot and dash in telegraphy is not significant so long as one is recognizable as being different from the other. Telegraphy is still widely used both in wired and wireless communication. Teletypewriter apparatus converts alphanumeric characters to code at the sending end and reconverts the code to alphanumeric characters at the receiving end. In early radio communication the transmitted frequency was interrupted to form dots and dashes but that form of communication has been largely supplanted by continuous wave communication in which an audible frequency modulates the carrier and the modulating frequency is keyed or interrupted for dots and dashes. The amplitude, frequency or phase of a carrier can be modulated, and the modulation may be in the form of pulses, as in radar, or by encoding the amplitudes of a sampled signal, as in pulse code modulation.

SUMMARY OF THE INVENTION

In my invention, I employ a pulse originator to generate pulses of as many different lengths, timewise, as are required by the number of alphanumeric characters to be transmitted. Hereinafter the term "alphanumeric characters" comprehends not only letters and numerals but also punctuation marks and any other symbols, even words or phrases if desired. Preferably those pulses comprise successive cycles of a single precisely controlled frequency and are used to modulate or interrupt a carrier frequency. My receiver also makes use of a precisely controlled oscillator of the same frequency as the pulse originator oscillator. The incoming signals gate the oscillator output, the lengths of the pulses so gated are measured by counters which translate those numbers to means for reading out the corresponding characters.

DESCRIPTION OF PREFERRED EMBODIMENTS

Figure 1:
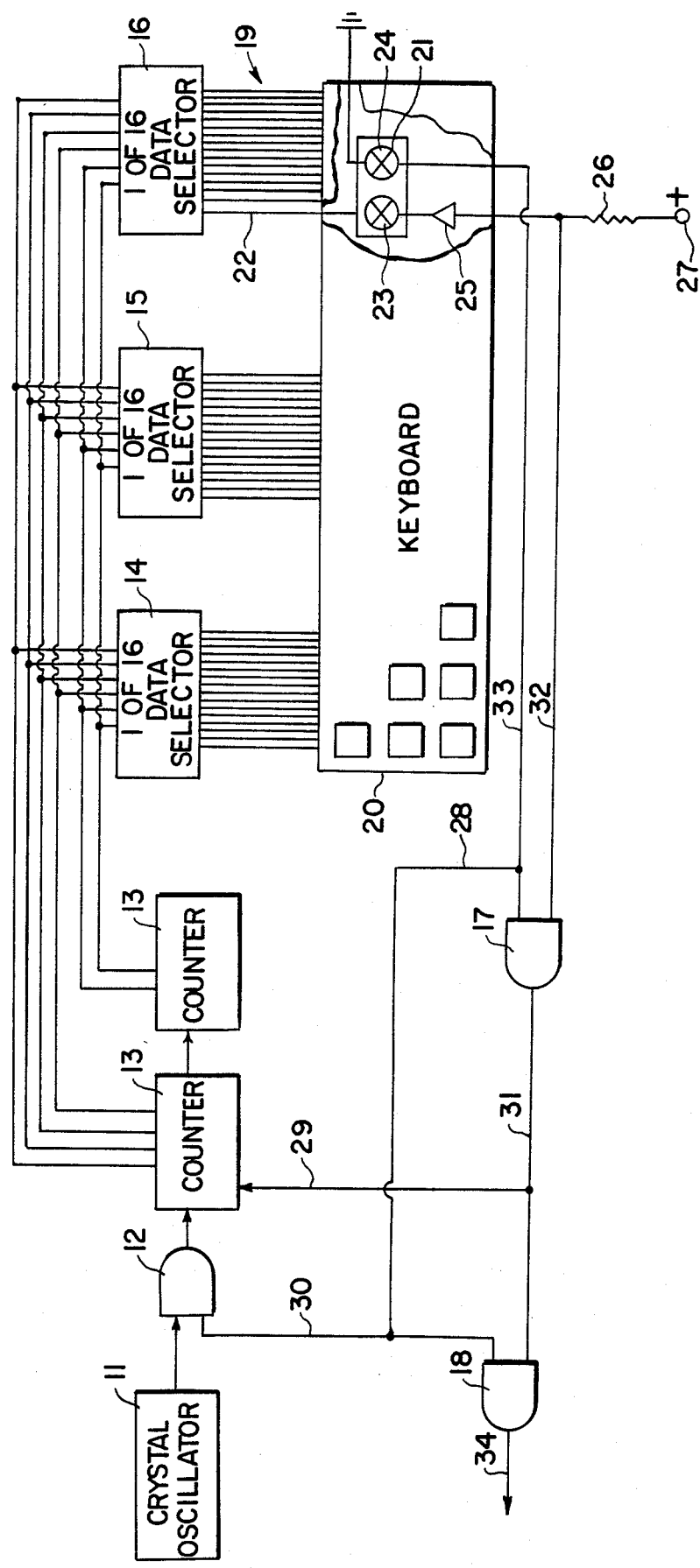
FIG. 1 is a schematic of my pulse originator apparatus.

In FIG. 1 a stable crystal oscillator 11 produces pulses. Its operating frequency is chosen high enough to provide pulses at a rate sufficient to enable timing to the required degree of accuracy. The output of oscillator 11 is connected through gate 12 to binary counters 13 and those counters are connected to three 1-of-16 data selectors 14, 15 and 16. Data selector 14 receives binary code signals corresponding to the group comprising 1 through 16 pulses. Binary code signals corresponding to more than 16 pulses do not affect data selector 14. Data selector 15 selects binary code signals corresponding to the group comprising 17 through 32 pulses and data selector 16 selects binary code signals corresponding to the group comprising 33 through 48 pulses. It is not essential that my pulse originating apparatus employ three 1-of-16 data selectors. It is essential only that it employ a data selector or selectors which will accommodate all the separate characters which are to be transmitted, and the arrangement shown accommodates all the alphanumeric characters required for most purposes. The 1-of-16 data selectors are commercially available components.

Each data selector has 16 output leads, the leads for data selector 16 being collectively designated 19. The output leads from all three data selectors are connected each to its own key in keyboard 20. That keyboard has as many keys as are required for the aggregate number of alphanumeric characters to be transmitted. A typical key 21 is shown broken away in FIG. 1 as being connected to the first lead 22 in the group 19 from data selector 16. Key 21 comprises two make-and-break switches 23 and 24. Switch 23 when closed connects lead 22 through diode 25 and resistor 26 with a positive voltage source 27 and also through lead 32 with one input of gate 17. Switch 24 when closed grounds the other input of gate 17 through conductor 33 and, through conductors 28 and 30, the other input of gate 12 and one input of gate 18. Gates 12, 17 and 18 are NAND gates. The other input of gate 18 is connected to the output of gate 17 through conductor 31 and through conductor 29 to the clear terminal of counters 13. Every other key in keyboard 20 is connected to ground and to conductor 32 and 33 in the same way but each key is connected to a different lead from one or the other of data selectors 14, 15 or 16.

In the operation of my pulse originator, oscillator 11 is turned on. Gate 12 will not open until its input connected to conductor 30 is grounded. When any key in keyboard 20 is depressed that grounding occurs through the closing of switch 24 which also grounds one terminal of gate 18 and allows it to open. The opening of gate 12 causes counters 13 to begin counting pulses from oscillator 11 and delivering output in binary code corresponding to the string of pulses they receive. Codes corresponding to pulses 1 through 16 will pass through data selector 14 advancing ground therethrough but if none of its associated keys is depressed nothing will happen and codes corresponding to pulses 17 through 22 will pass through data selector 15 in the same way. If key 21 is depressed however, the code corresponding to the 33rd pulse, which will be the first pulse entering data selector 16, will through isolating diode 25 overcome the positive voltage 27 on conductor 32. Gate 17 then passes a discrete continuous pulse corresponding to code 33 to conductors 29 and 31. The signal on conductor 29 stops counters 13. The same signal on conductor 31 also causes gate 18 to pass it to conductor 34, from where it can be used to interrupt or modulate a carrier frequency in any convenient way.

Figure 2:
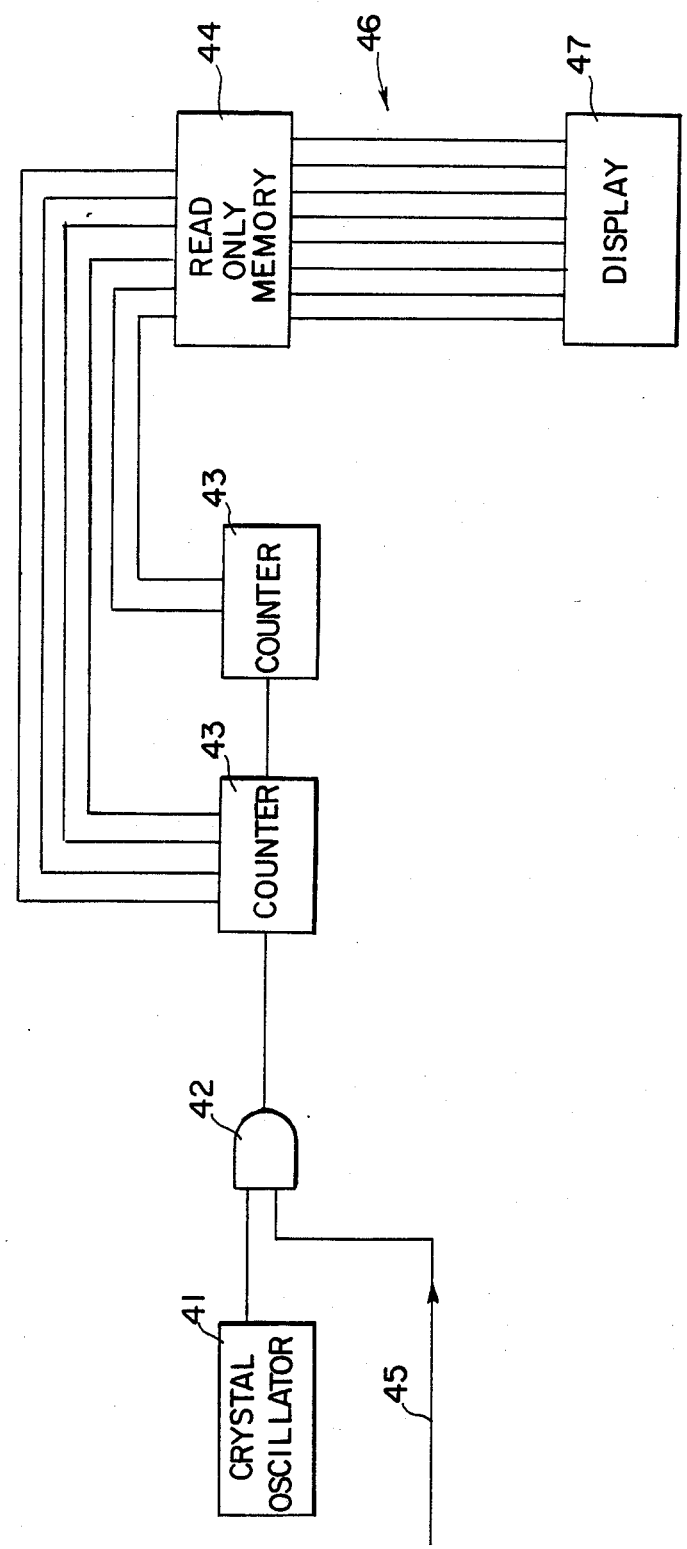
FIG. 2 is a schematic of my receiving apparatus.

The receiver or demodulator of my invention is shown in FIG. 2. A stable crystal oscillator 41 of the same frequency as oscillator 11 in my pulse originator of FIG. 1 is connected to one input of gate 42. The output of gate 42 is connected to the input of counters 43, which should be the same type as counters 13 previously described (in this case, binary) and the counters output is connected to the input of 256×8 read only memory 44. The 8 outputs of memory 44, designated collectively as 46, are connected to display device 47.

When a signal is received at the input 45 of my receiver it permits gate 42 to pass pulses from oscillator 41 to counters 43. As the two oscillators 11 and 41 operate at identical frequency the counters 43 will have the correct amount of time to count the exact number of pulses which were transmitted. That number is passed on to read-only memory 44 at the position corresponding to the number of pulses in the transmitted signal. As the counters of data selectors 14, 15 and 16 previously described operate on a binary code input, the input to memory 44 will be at the binary address representing the number of pulses for the character. transmitted. That memory, however, is programed to display the ASC11 code for the character transmitted.

It will be appreciated that switches 23 and 24 which constitute a double-pole single-throw switch must operate in exact synchronism or introduce a pulse timing error at short pulse timed lengths. The pulse originator of FIG. 1 is therefore suitable only when timed pulses are of relatively long length.

Figure 3:
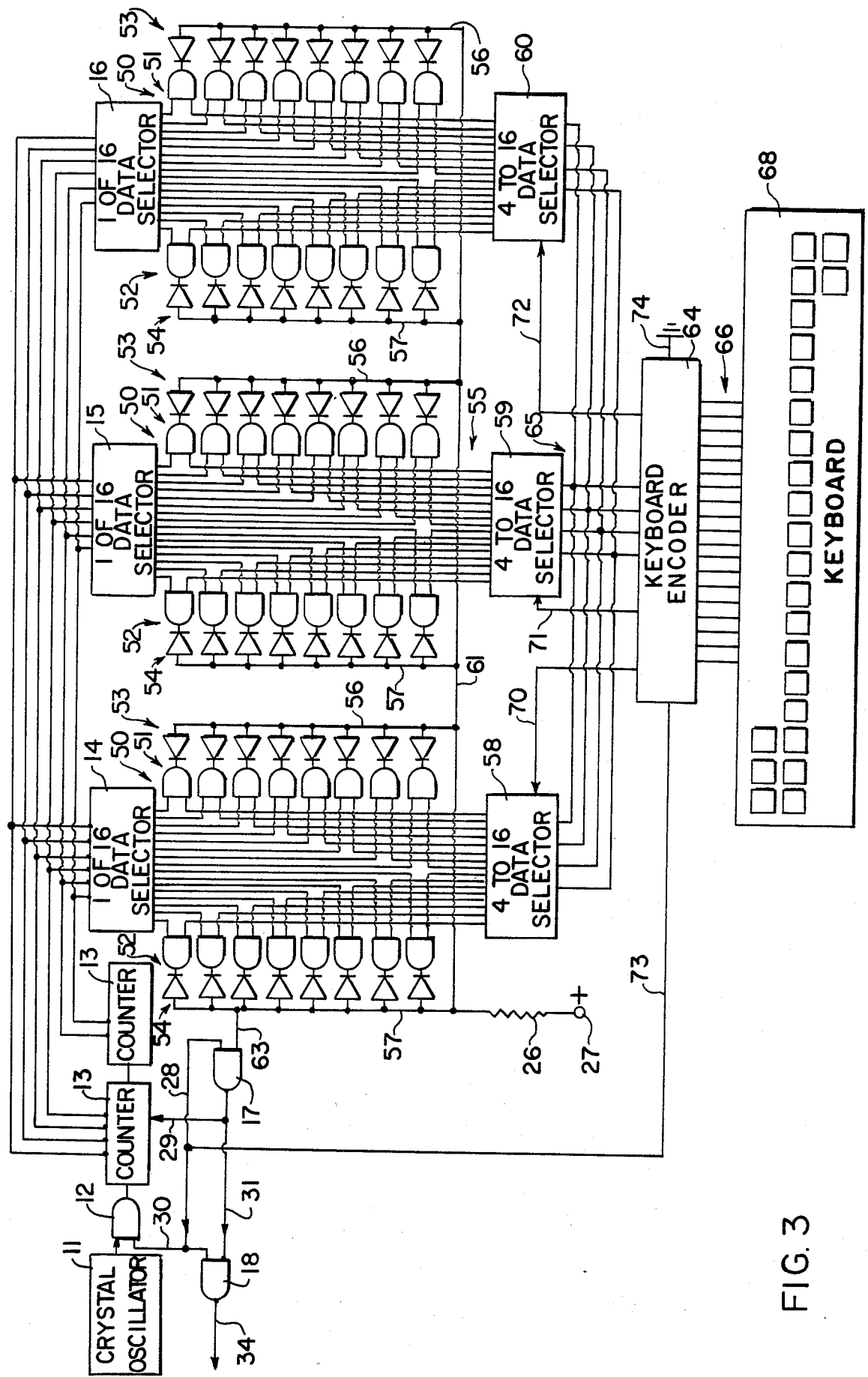
FIG. 3 is a schematic of a second embodiment of the pulse originator of FIG. 1.

A second embodiment of my pulse originator apparatus which is suitable for pulses of any length is illustrated in FIG. 3. Those components which are identical with components of FIG. 1 have the same reference characters.

As in FIG. 1 a stable crystal oscillator 11 produces pulses. Its operating frequency is chosen high enough to provide pulses at a rate sufficient to enable timing to the required degree of accuracy. The output of oscillator 11 is connected through gate 12 to counters 13 and those pulses go out in a series or string. The counters transform this string of pulses into a binary code and that code at any given instant will be equivalent to any number of pulses received. The counters 13 are connected to three 1-of-16 data selectors 14, 15 and 16. As before, data selector 14 receives signals from the group comprising 1 through 16 pulses. Signals comprising more than 16 pulses do not affect data selector 14. Data selector 15 receives signals from the group comprising 17 to 32 pulses and data selector 16 receives signals from the group comprising 33 through 48 pulses. Each data selector has 16 output leads; those leads from data selector 15, for example, being designated collectively 50. Each of those leads is connected with one input terminal of a separate OR gate. In the figure the 8 OR gates shown, one above the other, below and at the right of data selector 15, are designated collectively 51 and the 8 OR gates, one above each other, below and to the left of data selector 15, are designated collectively 52. The other input terminal of each OR gate 51 is connected by a separate lead with a separate one of the 16 output terminals of 4-to-16 data selector 59. The other output terminal of each OR gate 52 likewise is connected by a separate lead with a separate one of the 16 output terminals of 4-to-16 data selector 59. Those input leads from both groups of OR gates 51 and 52 are designated collectively 55. The output of each OR gate 51 is connected to the cathode of a separate diode, designated collectively 53. The anodes of those diodes 53 are connected to a conductor 56. The output of each OR gate 52 is connected to the cathode of a separate diode, designated collectively 54. The cathodes of those diodes 54 are connected to a conductor 57. Conductors 56 and 57 are connected to conductor 61.

One-of-16 data selector 14 is connected with 4-to-16 data selector 58 through 16 separate OR gates and diodes in the same way as has been described hereinabove. The same is true of 1-of-16 data selectors 16 and 4-to-16 data selector 60. In both, the cathodes of all diodes are connected to conductor 61. That conductor is connected to the junction of a resistor 26, the other end of which is connected to a source of positive potential 27, and a conductor 63 which is connected to one input terminal of gate 17.

The four input terminals of each data 4-to-16 selector 58, 59 and 60 are connected in parallel respectively to four output terminals of keyboard encoder 64, those conductors being collectively designated 65. Keyboard encoder 64 has 19 input terminals consisting of an X field of 8 leads and a Y field of 11 leads. These 19 conductors are designated collectively 66. Each 4-to-16 data selector 58, 59 and 60 has an enabling terminal which is connected to keyboard encoder 64 by leads 70, 71 and 72, respectively. Keyboard encoder 64 is connected to ground at 74 and to strobe lead 73, which is connected to one input each of gates 17 and 18. A suitable keyboard encoder is General Instruments AY-5-2376.

The operation of the apparatus of my FIG. 3 differs from that of FIG. 1 only in that the actuation of any key of keyboard 68 selects an alphanumeric character in the same way as switch 23 of FIG. 1 and the keyboard encoder 74 simultaneously generates a ground signal on strobe lead 73 thus taking the place of switch 24 of FIG. 1. The output 65 of keyboard encoder 64 is in binary code and 4-to-16 data selectors 58, 59 and 60 convert that code to the individual signals to data selectors 14, 15 and 16 as were provided by keyboard 68. The diodes, such as 53 and 54, prevent any gate, such as 51 and 52, from shorting other gates when it goes to a ground output condition. Resistor 26 provides a positive voltage on conductor 63 to maintain gate 17 in the proper mode between the arrival of the timed pulses, which are generated as grounds.

| COMPONENT TABLE | | | |
|---|---|---|---|
| Reference Character | Component | Manufacturer | Code Number |
| 13, 43 | counter | National | SN 74193 |
| 14, 15 and 16 | 1 of 16 data selector | National | SN 74154 |
| 58, 59 and 60 | 4 to 16 data selector | National | SN 74154 |
| 64 | keyboard encoder | General Instrument | AY5-2376 |
| 44 | read-only memory | Texas Instrument | 74S 471 |

In the foregoing specification I have described a presently preferred embodiment of my invention, however, it will be understood that my invention can be otherwise embodied within the scope of the following claims.

I claim:

1. A pulse originator for a timed pulse communication system comprising a stable fixed oscillator, oscillator output cycle counting means connecting said oscillator with data selecting means, alphanumeric keyboard controlled means for terminating the cycle count through said data selecting means and for generating a continuous pulse of duration equal to the aggregate duration of said counted cycles, first means for gating the output of said fixed oscillator into said output cycle counting means and second means for gating said output pulse into said pulse originator output, both of said gating means being connected with each key of said keyboard, whereby an output pulse corresponding to a unique number of cycles is selected by depressing any key of said keyboard.

2. Apparatus of claim 1 including third gating means connected with each key of said keyboard for transmitting a clearing signal to said output cycle counting means.

3. Apparatus of claim 2 in which each key of said keyboard operates a separate make-and-break switch and means for providing a strobe signal synchronous with said switch operation to said first, second and third gating means.

4. Apparatus of claim 2 in which the said means are NAND gates having one input of each connected with each key of said keyboard.

5. Apparatus of claim 1 including first, second and third NAND gates, first and second means actuated by depression of any key of said keyboard connecting one input of said second gate to said data selector and connecting the other input of said second gate and one input of said first gate and one input of said third gate to ground, respectively, means connecting the other input of said first gate with said oscillator, means connecting the output of said first gate with said counter, means connecting the output of said second gate with the other input of said third gate and with the clear terminal of said counter, and an output connection for said output pulse from said third gate.

6. Apparatus of claim 1 in which said second means include means for generating a strobe signal simultaneously with the actuation of said first means.

7. A receiver for timed pulse communication systems using the pulse originator of claim 1 comprising a stable local oscillator of the same frequency as the oscillator of the transmitter pulse originator, local oscillator output cycle counting means connecting said local oscillator with a read-only memory, display means connected with said read-only memory and means for gating the said local oscillator by the received signals.

* * * * *